United States Patent
Namaky (12)

(10) Patent No.: US 6,384,608 B1
(45) Date of Patent: May 7, 2002

(54) BATTERY TESTER USING INTERNAL RESISTANCE TO MEASURE A CONDITION OF A BATTERY

(75) Inventor: Hamid Namaky, South Russell, OH (US)

(73) Assignee: Actron Manufacturing Co., Cleveland, OH (US)

( * ) Notice: Subject to any disclaimer, the term of this patent is extended or adjusted under 35 U.S.C. 154(b) by 0 days.

(21) Appl. No.: 09/805,269

(22) Filed: Mar. 13, 2001

(51) Int. Cl.$^7$ ............................................. G01N 27/416
(52) U.S. Cl. ..................................................... 324/430
(58) Field of Search ................................. 324/425, 426, 324/429, 430, 433; 320/132, DIG. 21

(56) References Cited

U.S. PATENT DOCUMENTS

| | | |
|---|---|---|
| 2,161,495 A | 6/1939 | Witte et al. |
| 2,229,009 A | 1/1941 | Berry |
| 2,267,826 A | 12/1941 | Heyer |
| 3,356,936 A | 12/1967 | Smith |
| 3,676,770 A | 7/1972 | Sharaf et al. |
| 3,731,189 A | 5/1973 | Sharaf et al. |
| 3,753,094 A | 8/1973 | Furuishi et al. |
| 3,783,378 A | 1/1974 | Mildner |
| 3,808,522 A | 4/1974 | Sharaf |
| 3,873,911 A | 3/1975 | Champlin |
| 3,909,708 A | 9/1975 | Champlin |
| 3,946,299 A | 3/1976 | Christianson et al. |
| 4,024,523 A | 5/1977 | Arnold et al. |
| 4,052,717 A | 10/1977 | Arnold et al. |
| 4,125,894 A | 11/1978 | Cashel et al. |
| 4,193,025 A | 3/1980 | Frailing et al. |
| 4,204,162 A | 5/1980 | Froidevaux |
| 4,231,027 A | 10/1980 | Mann et al. |
| 4,272,806 A | 6/1981 | Metzger |
| 4,322,685 A | 3/1982 | Frailing et al. |
| 4,333,149 A | 6/1982 | Taylor et al. |
| 4,423,378 A | 12/1983 | Marino et al. |
| 4,423,379 A | 12/1983 | Jacobs et al. |
| 4,433,294 A | 2/1984 | Windebank |
| 4,498,044 A | 2/1985 | Horn |
| 4,520,353 A | 5/1985 | McAuliffe |
| 4,598,373 A | 7/1986 | Morishita et al. |
| 4,678,998 A | 7/1987 | Muramatsu |
| 4,697,134 A | 9/1987 | Burkum et al. |
| 4,719,427 A | 1/1988 | Morishita et al. |
| 4,719,428 A | 1/1988 | Liebermann |
| 4,816,768 A | 3/1989 | Champlin |
| 4,888,716 A | 12/1989 | Ueno |
| 4,929,931 A | 5/1990 | McCuen |
| 4,968,942 A | 11/1990 | Palanisamy |
| 5,047,722 A | 9/1991 | Wurst et al. |
| 5,194,799 A | 3/1993 | Tomantschger |
| 5,241,275 A | 8/1993 | Fang |
| 5,281,919 A | 1/1994 | Palanisamy |
| 5,295,078 A | 3/1994 | Stich et al. |
| 5,321,627 A | 6/1994 | Reher |
| 5,381,096 A | 1/1995 | Hirzel |
| 5,592,093 A | 1/1997 | Klingbiel |
| 5,721,688 A | 2/1998 | Bramwell |
| 5,757,192 A | 5/1998 | McShane et al. |
| 5,821,756 A | 10/1998 | McShane et al. |

FOREIGN PATENT DOCUMENTS

| | | |
|---|---|---|
| DE | 22 44 285 B2 | 9/1972 |
| DE | 3116371 A1 | 4/1981 |
| DE | 380027 A1 | 8/1989 |
| EP | A1 0022 450 | 11/1980 |
| EP | 0 323 539 A1 | 8/1988 |
| EP | 0 382 923 A2 | 12/1989 |
| EP | 0 391 106 A1 | 3/1990 |
| EP | 0 391 242 A2 | 3/1990 |
| EP | 0 505 622 A2 | 12/1991 |
| EP | 0 514 265 A2 | 5/1992 |
| EP | 0425 044 A1 | 10/1999 |
| FR | 776529 | 5/1971 |
| GB | 1 502 434 | 1/1975 |
| GB | 2 121 971 A | 6/1983 |
| GB | 2148518 A | 5/1985 |
| GB | 2 561 391 | 11/1985 |

OTHER PUBLICATIONS

Research Disclosure, Mar. 1978 p. 14.
Resistance, Chapters 7 and 8; pp. 318–332.
Time Effects in Conductivity Measurements of Lead/Acid Battery Electrodes, Journal of Power Sources, 30 (19900) 309–314.
Field and Laboratory Studies to Assess the State of Health of Valve–Regulated Lead Acid Batteries: Part 1 Conductance/Capacity Correlation Studies; Dr. David O. Feder, pp. 218–233.
Conductance Testing Compared To Traditional Methods Of Evaluating The Capacity Of Valve–Regulated Lead/Acid Batteries And Predicting State–Of–Health; Journal of Power Sources, 40( 1992) 235–250.

*Primary Examiner*—Edward H. Tso
(74) *Attorney, Agent, or Firm*—Calfee, Halter & Griswold LLP

(57) ABSTRACT

A method of measuring a condition of a battery is disclosed comprising the steps of: inducing an AC signal across the terminals of the battery by applying an AC current load thereto; measuring the induced AC signal and converting it to a first voltage potential signal which is a measure of the battery's internal resistance; applying the first voltage potential signal across a voltage divider network calibrated in accordance with a predetermined battery rating scale to render a multiplicity of second voltage potential signals at a corresponding multiplicity of taps along the voltage divider network, values of the second voltage potential signals being representative of the calibrated battery rating scale; and sequentially selecting the second voltage potential signals along the taps for comparison with a threshold voltage potential signal to determine a measure of the condition of the battery. An electronic battery tester is also disclosed including a voltage divider network coupled across the first voltage potential signal and calibrated in accordance with a predetermined battery rating scale to create from the first voltage potential signal a multiplicity of second voltage potential signals at a corresponding multiplicity of taps along the voltage divider network, and a rotary switch for selecting the second voltage potential signal of the multiplicity of second voltage potential signals along the taps based on a predetermined battery rating of the battery under test for comparison with a threshold voltage potential signal to determine a condition of the battery.

20 Claims, 3 Drawing Sheets

BATTERY TESTER USING INTERNAL RESISTANCE TO MEASURE A CONDITION OF A BATTERY

BACKGROUND OF THE INVENTION

The present invention is directed to battery testers of the AC current load type, in general, and more particularly, to a battery tester including a voltage divider network calibrated in accordance with a predetermined battery rating scale to adjust a measured signal representative of the internal resistance of the battery under test to render a voltage potential signal which when compared to a threshold voltage potential determines the condition of the battery.

Modem AC current load type electronic battery testers, like the KM4500 manufactured by ACTRON Manufacturing, Inc. under the registered trademark KAL EQUIP, include a microcontroller with embedded software for managing the functions thereof, like keyboard sensing, display driving, and control of the analog circuitry which interface with the battery, for example. Typically, the user enters information of the battery under test using keys on a panel and reads the information through an alphanumeric display which may be of the liquid crystal type, for example. The microcontroller controls the analog circuitry coupled to the battery under test and processes the measured battery signals to determine the battery's condition under control of the embedded software routines. While very successful, these type testers are considered at the high end of battery testing equipment spectrum due to their sophistication and multifunctional capabilities.

What is needed is a battery tester that is less sophisticated, simple to use and lower in cost to fill a void at the low end of the equipment spectrum. Through the years, some have attempted to fill this gap by offering simple electronic battery testers without utilizing a microcontroller. Examples of these simple electronic testers are found in the following U.S. Patents:

1. U.S. Pat. No. 3,909,708, issued on Sep. 30, 1975 to Champlin and entitled "Electronic Battery Testing Device";
2. U.S. Pat. No. 4,719,428, issued on Jan. 12, 1998 to Liebermann and entitled "Storage Battery Condition Tester Utilizing Low Load Current";
3. U.S. Pat. No. 4,816,768 issued on Mar. 28, 1989 to Champlin and entitled "Electronic Battery Testing Device"; and
4. U.S. Pat. No. 5,592,093 issued on Jan. 7, 1997 to Klingbiel and entitled "Electronic Battery Testing Device Loose Terminal Connection Detection Via A Comparison Circuit".

The present invention offers an alternative to these type electronic battery testers which is simple to use, low in cost and provides aspects not found therein.

SUMMARY OF THE INVENTION

In accordance with one aspect of the present invention, a method of measuring a condition of a battery using a measure of the internal resistance thereof comprises the steps of: inducing an AC signal across the terminals of the battery by applying an AC current load thereto; measuring the induced AC signal and converting it to a first voltage potential signal which is a measure of the battery's internal resistance; applying the first voltage potential signal across a voltage divider network calibrated in accordance with a predetermined battery rating scale to render a multiplicity of second voltage potential signals at a corresponding multiplicity of taps along the voltage divider network, values of said second voltage potential signals being representative of the calibrated battery rating scale; and sequentially selecting the second voltage potential signals along the taps for comparison with a threshold voltage potential signal to determine a measure of the condition of the battery.

In accordance with another aspect of the present invention, an electronic battery in tester comprises: a first circuit for applying an AC current load to the battery under test to induce an AC signal across the terminals of the battery; a second circuit for measuring the induced AC signal and converting it to a first voltage potential signal which is a measure of the battery's internal resistance; a voltage divider network coupled across the first voltage potential signal, said voltage divider network calibrated in accordance with a predetermined battery rating scale to create from the first voltage potential signal a multiplicity of second voltage potential signals at a corresponding multiplicity of taps along the voltage divider network, values of said second voltage potential signals being representative of the calibrated battery rating scale; and means for selecting the second voltage potential signal of the multiplicity of second voltage potential signals along the taps based on a predetermined battery rating of the battery under test for comparison with a threshold voltage potential signal to determine a condition of the battery.

DETAILED DESCRIPTION OF THE INVENTION

Figure 1:
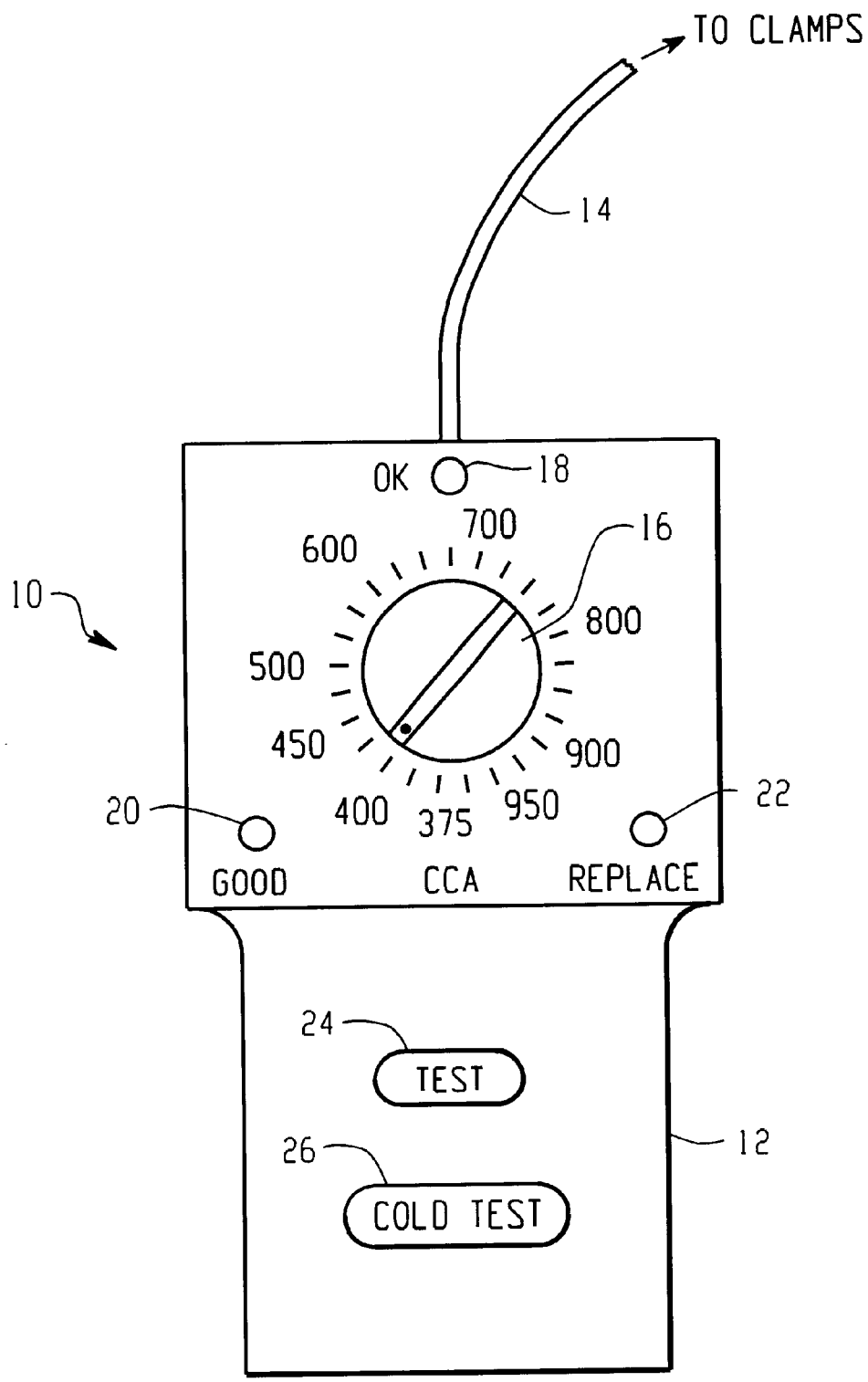
FIG. 1 is a top view of a battery tester suitable for embodying the principles of the present invention.
Figure 2A:
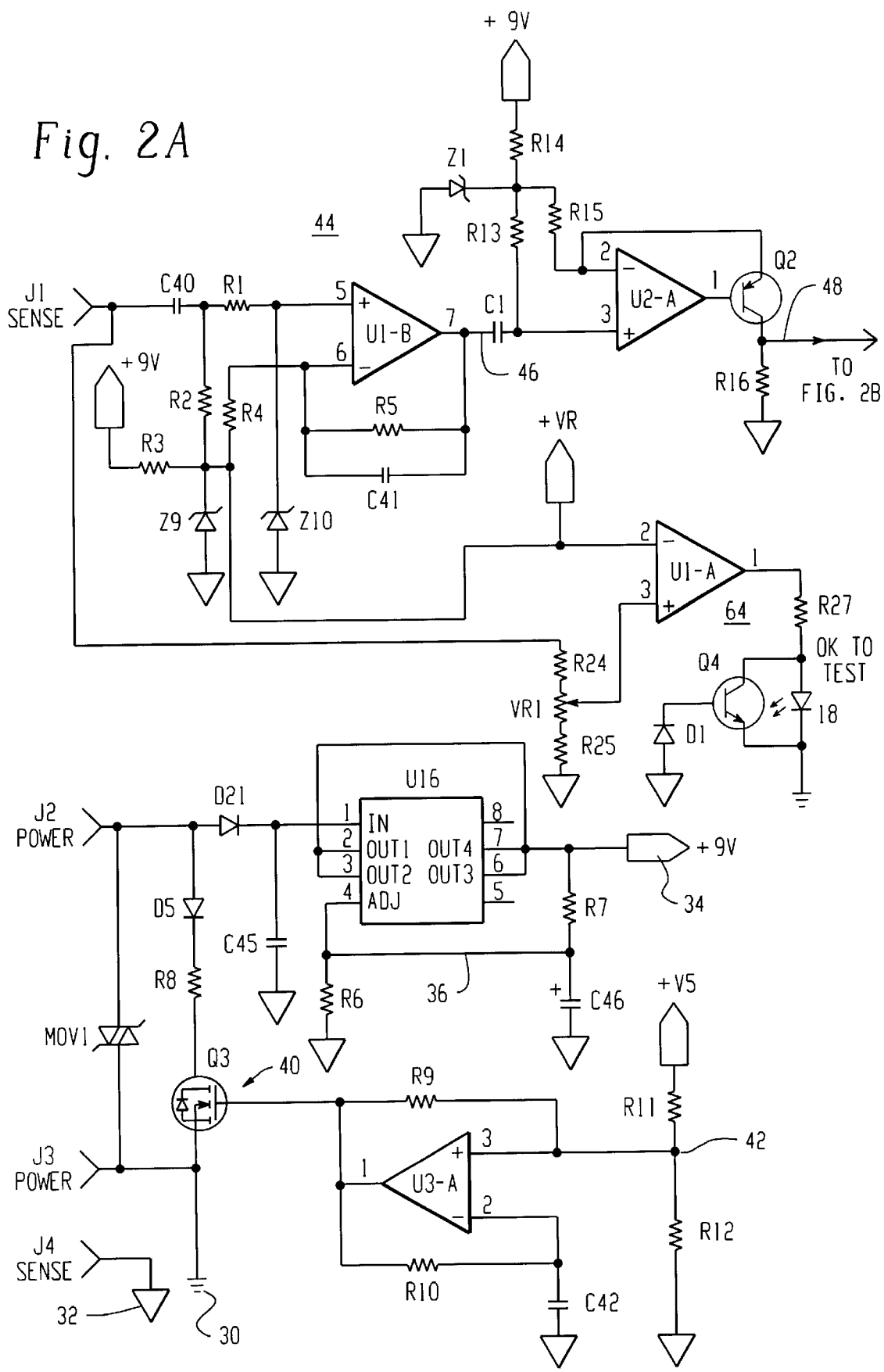
FIGS. 2A and 2B combine to depict a circuit schematic of a electronic tester unit suitable for use in the battery tester embodiment of FIG. 1.

An embodiment of an electronic battery tester 10 is described herein below in connection with FIGS. 1, 2A and 2B. FIG. 1 depicts the battery tester 10 as a hand held unit which includes an electronic tester unit which will be described in connection with a circuit embodiment depicted in FIGS. 2A and 2B. Two connectors, which may be conventional battery clamps (not shown), for example, are used to connect to the positive and negative terminals of a battery under test to the battery tester 10 through leads 14. In the present embodiment, a power supply lead and a sense supply lead couple the positive battery terminal via one of the connectors to the electronic tester unit as shown in FIG. 2A. Also, a power return lead and a sense return lead couple the negative battery terminal via the other connector to the electronic tester unit as shown in FIG. 2A. In addition, the power and sense supply leads may be coupled respectively to each side of the positive terminal battery clamp which may be isolated from each other and the power and sense return leads may be coupled respectively to each side of the negative terminal battery clamp which may be also isolated from each other.

The panel 12 of the hand held unit 10 includes a multiple throw single pole rotary switch 16 with the throw positions thereof marked with indicia of an industry standard battery rating scale. For the present embodiment, the battery manufacture's "cold cranking amperes" (CCA) rating which corresponds to the original internal resistance of the battery is used and the indicia marking scale ranges over hundreds of CCAs, like 375 CCA to 950 CCA in equal increments of 25 CCA, for example. Included on the panel are three indicators 18, 20 and 22 which may be different colored light emitting diodes (LEDs). For example, the indicator 18 may be a green LED and represent when lit an OK to Test, the indicator 20 may be a green LED and represent when lit a good battery condition, and the indicator 22 may be a red LED and represent when lit a replace battery condition. The indicators 18, 20 and 22 may be labeled appropriately on the panel. Also included on the panel 12 is at least one switch for selecting between a normal test mode and a cold test mode for battery tester operation. In the present embodiment, there are two mechanical switches 24 and 26 coupled to the electronic tester unit for this purpose. Switch 24 when actuated causes the unit to be in the normal test mode and switch 26 when actuated causes the unit to be in the cold test mode as will become more evident from the description herein below.

While the invention is being described in connection with a hand held unit 10, it is understood that it may be embodied in any form without deviating from the present embodiment and in fact, need not even be of the portable variety. Also, any battery rating scale may be used and the indicia marked for the throw positions of the rotary switch accordingly. Still further, any type of indicators may be used in any color combination and one switch or more than two switches may be used for mode selection also without deviating from the present invention. Accordingly, it is not the intention of Applicant to limit the invention to any specific embodiment, but rather to provide an embodiment to describe the principles of the invention simply by way of example.

Figure 2B:
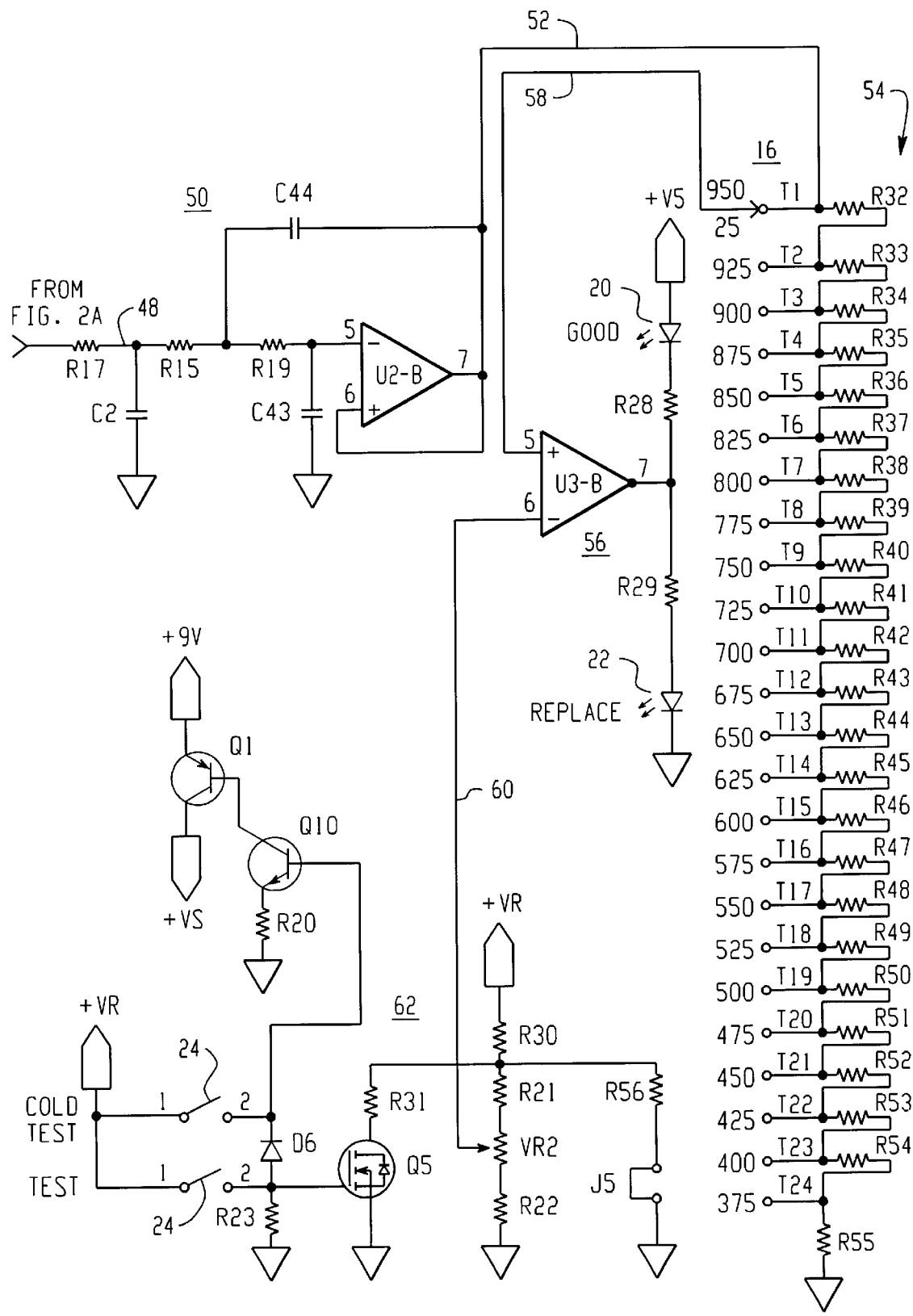

Referring now to FIGS. 2A and 2B, the electronic tester unit may be embodied on a printed circuit (PC) card, for example, and the power and sense supply leads of the leads 14 may be coupled to pins J2 and J1, respectively, thereof. In addition, the power and sense return leads of the leads 14 may be coupled to pins J3 and J4 of the PC card. On the PC card, a power ground bus denoted by a lined arrow like that shown at 30, for example, is coupled to pin J3 and distributed throughout electronic tester unit and a sense ground bus denoted by an unfilled arrow like that shown at 32, for example, is coupled to pin J4 and distributed throughout the electronic tester unit. Coupled across the power supply and return connections of pins J3 and J4 is a surge suppressor MOV1 which may be of a conventional type, for example. Power connector pin J2 is coupled through a diode D21 (anode to cathode) to an input (pin 1) of a conventional voltage regulator integrated circuit U16, which may be an LM317 voltage regulator, for example. Pin 1 of U16 maybe coupled to the sense ground bus 32 through a filtering capacitor C45. For the sake of brevity, exemplary values of the various circuit components will be provided in a table following the description of FIGS. 2A and 2B. Output pins 2, 3, 6, and 7 of U16 are coupled together to provide a regulated reference voltage potential, which may be on the order of +9V, for example, over a bus 34 to appropriate circuits of the tester unit which will become apparent from the following description. All of the operational amplifiers of the tester unit may be driven from the 9V regulated voltage and returned through the sense ground bus 32. A resistance divider network comprising resistors R6 and R7 are coupled form the bus 34 to the sense ground bus 32 and the node 36 thereof is coupled to the voltage adjustment (pin 4) of U16 which is coupled to the sense ground bus 32 through a capacitor C46. Note that if the power supply lead or the sense return lead are not properly connected to the battery under test, the regulated reference voltage may not be generated over the bus 34.

An alternating current (AC) load may be applied across the battery under test periodically at a predetermined frequency by the circuit 40 when enabled to induce an AC signal across the battery terminals representative of the internal resistance of the battery. Circuit 40 includes a series combination of a diode D5, load resistor R8 and an electronic switch Q3, which may be a metal oxide semiconductor field effect transistor (MOSFET) of the type known as MTD035055VL, for example, coupled from the power supply lead connector J2 to the power return lead connector J3. Driving the MOSFET Q3 is an oscillator circuit comprising an operational amplifier U3-A which may be one of the amplifiers of an integrated circuit of the type known as LM356, for example, the output of U3-A being coupled to the gate of the MOSFET Q3. In addition, the output of U3-A is coupled to its non-inverting (+) input through a resistor R9 and also to its inverting (−) input through a resistor R10. The (−) input of U3-A is coupled to the ground bus 32 through a capacitor C42 and the (+) input is also coupled to a node 42 of a resistor divider network of resistors R11 and R12 coupled between a controlled voltage potential VS and the ground bus 32. As will become more evident from the following description, application of the voltage VS enables the operation of the AC load circuit 40 to periodically and with a substantially equal on-off duty cycle apply a current load via load resistor R8 to the battery under test. The frequency of the AC load circuit 40 may be set by the values selected for R10 and C42. Note that if the power supply lead or sense return lead or power return lead are not properly connected to the battery, the AC load circuit 40 may be disabled from operating.

The induced AC voltage signal is supplied to a measuring circuit 44 from the sense supply lead via pin J1 through a decoupling capacitor C40. A first portion of the measuring circuit 44 comprises an operational amplifier U1-B which may also be one of the amplifiers of an LM356 integrated circuit, for example. A reference voltage denoted as VR, which may be on the order of 6.8V, for example, is generated from a resistor R3 and zener diode Z9 series combination coupled across the regulated voltage bus 34 and ground bus 32. VR may be applied to various circuits of the tester unit to provide a convenient DC bias as will become more apparent from the description below. For example, VR is coupled to the decoupled side of capacitor C40 through resistor R2 and coupled to the (−) input of amplifier U1-B through resistor R4. The decoupled side of C40 is also coupled to the (+) input of U1-B through resistor R1 and the (+) input is clamped to a voltage potential, like on the order of 8.2V, for example, set by a zener diode Z9 coupled between the (+) input and ground bus 32. Accordingly, the induced AC signal at the input of the measuring circuit 44 is biased to the quiescent voltage VR. A closed loop gain resistor R5 and filtering capacitor C41 are coupled in parallel across the output to (−) input of amplifier U1-B. The output of amplifier U1-B is input to a second portion of the measuring circuit 44 which will now be described.

The second portion of the measuring circuit 44 comprises another operational amplifier U2-A which may be one of the amplifiers of the integrated circuit LM356, for example. The amplified AC signal from the first portion over line 46 is decoupled by another capacitor C1 and input to the (+) input of U2-A. A reference voltage on the order of 6.8V, for example, is generated from a series combination of resistor R14 and zener diode Z1 coupled across the regulated voltage bus 34 and ground bus 32 and used to bias the (+) and (−) inputs of the amplifier U2-A. Coupled between the output and (−) input of amplifier U2-A is the emitter-base junction of an PNP bipolar transistor Q2. The collector of Q2 is coupled to the ground bus 32 through a resistor R16. In essence, the second portion of the measuring circuit 44 rectifies the decoupled AC signal using amplifier U2-A and the PNP transistor Q2 inverting only those portions of the decoupled AC signal below 6.8V and referencing the resulting inverted AC signal, which appears across resistor R16, to the potential of the ground bus 32. The resulting AC signal is provided to a downstream active filtering circuit 50 over signal line 48 which is referenced to the ground bus 32.

The filtering circuit 50 is configured as a three pole active filter using an operational amplifier U2-B which may be another amplifier from the integrated circuit LM356, for example. More specifically, signal line 48 is coupled through a series connection of three resistors R17, R18 and R19 to the (+) input of amplifier U2-B. The connecting node between R17 and R18 is coupled to the ground bus 32 through a capacitor C2 and the connecting node between R18 and R19 is coupled to the output of U2-B through a capacitor C44. The (+) input of U2-B is coupled to ground bus 32 through a capacitor C43 and the (−) input thereof is coupled to the output of U2-B. Accordingly, a substantially DC voltage potential signal, which is representative of the measured internal resistance of the battery under test, is output from amplifier U2-B over signal line 52.

Prior to being compared with a threshold voltage potential, the DC voltage potential over line 52 is applied across a voltage divider network 54 which is calibrated in accordance with an industry standard battery rating scale to render a multiplicity of voltage potential signals at a corresponding multiplicity of taps along the voltage divider network 54. The values of the tapped voltages are representative of the calibrated battery rating scale. In the present embodiment, the voltage divider network 54 is a resistor divider network comprising a series string of resistors R32 to R55 coupled across line 52 and the ground bus 32. Voltage taps T1 through T24 are provided at the corresponding interconnecting nodes. For example, tap T1 is provided at the connection between line 52 and resistor R32, tap T2 is provided at the connection between resistor R32 and R33, and so on, until tap T24 which is provided at the connecting node between R54 and R55. The voltage divider network 54 of the present embodiment is calibrated for a "cold cranking amperes" (CCAs) industry standard permitting equal CCA increments of 25 CCAs ranging from 375 CCA to 950 CCA as described for the rotary switch 16 of FIG. 1. Accordingly, the throw positions of switch 16 marked with the indicia 950 CCA to 375 CCA are coupled to the respectively corresponding voltage taps T1 through T24 to adjust the voltage potential signal representative of measured internal resistance based on the battery manufacturer's standard rating of the battery under test selected by the switch 16.

The pole position 58 of switch 16 which carries the switch selected voltage potential of the taps T1 through T24 is coupled to a comparator circuit 56 comprising another operational amplifier U3-B which may be another amplifier from the integrated circuit LM356, for example, the pole position 58 being coupled to the (+) input of U3-B. A threshold voltage is generated over signal 60 and coupled to the (−) input of U3-B for comparison with the selected voltage potential 58. This threshold voltage potential is representative of the original internal resistance of a battery of a predetermined battery rating which may be the highest of the battery ratings of the, rating scale, for example. The comparator circuit 56 drives the good and replace indicators 20 and 22, respectively, based on the results of the comparison. For example, if the selected voltage potential 58 is greater than the threshold voltage potential 60, representing a replace condition, then the comparator circuit 56 turns indicator 22 "on" through resistor R29. Otherwise, a good condition is measured and the indicator 20 is turned "on" by the comparator circuit 56 using current drawn from the controlled voltage potential VS through a resistor R28.

A circuit 62 for generating the threshold voltage potential over line 60 is governed by the normal test mode switch 24 and cold test mode switch 26. More specifically, a series string of resistors R30, R21, potentiometer VR2 and R22 is coupled between the reference voltage potential VR and the ground bus 32. The tap of potentiometer VR2 is coupled to line 60 over which the threshold signal is carried to the comparator circuit 56. Thus, the threshold voltage 60 may be adjusted during calibration of the tester unit using the potentiometer VR2. Also, included in circuit 62 is a series combination of another resistor R31 and an electronic switch Q5 that is coupled across the connecting node between resistors R30 and R21 and the ground bus 32. In the present embodiment, the electronic switch Q5 may be a MOSFET of the type known as 2N7002LT1, for example. Coupled to the gate of the MOSFET Q5 are a resistor R23 to ground bus 32, the throw position of switch 24 and the anode of a diode D6. The cathode of diode D6 is coupled to the throw position of switch 26 and the base of a NPN bipolar transistor Q10. The pole positions of switches 24 and 26 are coupled to the reference voltage VR. So, when the normal test mode switch 24 is actuated, electronic switch Q5 is turned "on" connecting resistor R31 in parallel with the resistor string R21, VR2, and R22, thus lowering the threshold voltage 60 commensurately with the change in resistance. In addition, when the cold test mode switch 26 is actuated, diode D6 blocks the voltage VR from the gate of switch Q5 which is held at ground potential through resistor R23. Thus, electronic switch Q5 is maintained in the "off" state causing R31 to be disconnected from the circuit 62. Accordingly, the threshold voltage 60 is substantially greater in value in the cold test mode than in the normal test mode. A resistor R56 in series with a jumper connection J5 is coupled across the node connection between R30 and R21 and the ground bus 32 so that At the threshold voltage 60 may be calibrated when the PC card is not connected to the switches 24 and 26. Under normal operating conditions, the jumper connection J5 is left open circuited.

Switches 24 and 26 are also coupled to an electronic switch comprising a combination of bipolar PNP and NPN transistors Q1 and Q10, respectively, which turn voltage potential By VS "on" and "off". More specifically, the throw positions of switches 24 and 26 are coupled directly or through diode D6 to the base of the NPN transistor Q10. The emitter of Q10 is coupled to ground bus 32 through resistor R20 and its collector is coupled to the base of the PNP transistor Q1. The emitter of Q1 is coupled to the regulated reference voltage bus 34 and its collector is coupled to the controlled reference voltage bus VS. Thus, in operation, when either mode switch 24 or 26 is actuated (i.e. closed), transistors Q10 and Q1 are turned "on" which conducts the regulated voltage potential on bus 34 to the VS bus (turning VS "on"). This operation enables the AC load circuit 40 to commence applying an AC load across the battery to induce the AC voltage signal representative of the battery's internal resistance and enables the indicator 20 to be lit when driven by comparator circuit 56.

The electronic tester unit also includes a terminal connection detection circuit 64 which determines whether or not the battery connectors are properly connected to the battery under test. Circuit 64 includes a series combination of resistors R24, potentiometer VR1 and R25 coupled across the sense supply lead at J1 and the ground bus 32. The tap of VR1 is coupled to the (+) input of an operational amplifier U1-A which may be an amplifier of the integrated circuit LM356, for example. The (−) input of the amplifier U1-A is coupled to the reference voltage potential VR and its output drives the indicator 18 (OK to Test) through resistor R27 to the power ground bus 30. An electronic switch Q4 is coupled across the indicator 18 for inhibiting the operation thereof. In the present embodiment, the switch Q4 is a NPN bipolar transistor having its collector coupled to the anode of the LED 18 and its emitter coupled to the power ground bus 30. The base of Q4 is coupled to the sense ground bus 32 through a diode D1 (cathode to anode).In operation, if all of the leads of 14 are properly connected to the battery under test, then the tap voltage of the potentiometer VR1 will be greater than the voltage reference VR (set at 6.8V), causing amplifier U1-A to drive indicator 18 "on". A visual observation of the indicator 18 lit indicates to the user that the connectors are properly connected to the battery and it is OK to commence the test for the battery's condition.

However, if the sense supply lead is not properly connected to the battery, then the voltage at the tap of potentiometer VR1 will be lower than VR and the amplifier will not drive indicator 18 "on". If the power supply lead is not properly connected, then amplifier U1-A will be disabled and unable to drive indicator 18 "on". If the power return lead is not properly connected to the battery, there will be no return path from the indicator 18 maintaining it in the "off" state. Also, if the sense return lead is not properly connected to the battery, then the current over the bus 32 on the PC card will flow through the path of D1 and the base-emitter junction of Q4 to return to the battery through the power return lead via ground bus 30. In this state, Q4 is turned "on" (i.e. conducting), thus diverting the current that would normally flow through LED 18 through the transistor Q4. Accordingly, indicator 18 is inhibited from being turned "on". Therefore, if after connecting the connectors of the tester 10 to the terminals of the battery under test the indicator 18 does not light, the user will know that the connectors are not properly connected and may attempt to reconnect until the indicator 18 lights.

The following table provides exemplary values for the various resistors (in ohms) and capacitors (in microfarads) unless otherwise specified. The resistors are generally ⅛ watt and 1% and the capacitors are rated at 50V, unless otherwise specified.

TABLE I

| R1 | 10.0K | R2 | 56.2K | R3 | 475 | R4 | 1.00K |
|---|---|---|---|---|---|---|---|
| R5 | 200K | R6 | 1.50K | R7 | 243 | R8 | 15 |
| R9 | 1.00K | R10 | 61.9K | R11 | 10.0K | R12 | 10.0K |
| R13 | 56.2K | R14 | 475 | R15 | 1.00K | R16 | 4.99K |
| R17 | 562K | R18 | 562K | R19 | 562K | R20 | 2.74K |
| R21 | 226K | R22 | 30.1K | R23 | 56.2K | R24 | 43.2K |
| R25 | 53.6K | R27 | 681 | R28 | 681 | R29 | 2.74K |
| R30 | 1.00K | R31 | 4.02K | R32–R54 | | | 1.00K |
| R55 | 15.0K | R56 | 4.02K | | | | |
| C1 | 0.47 | C2 | 0.033 | C40 | 0.47 | C41 | 3300pF |
| C42 | 0.033 | C43 | 0.01 | C44 | 0.047 | C45 | 0.1 |
| C46 | 10 | | | | | | |

Now, a description of operation of the battery tester 10 will be provided with reference to the drawings of FIGS. 1, 2A and 2B. If the indicator 18 (OK to Test) is lit indicating a proper connection of the connectors to the terminals of the battery under test, then a battery rating may be set by the rotary switch 16 on the panel 12. The user may read from the battery under test the manufacturer's industry standard battery rating which should be provided on the battery itself or on specification literature associated therewith. In the present embodiment, "cold cranking amperes" (CCAs) are used as the battery rating by way of example because this rating is an adequate representation of the original internal resistance of the battery. For example, suppose the battery under test has a manufacture's rating of 450 CCAs, then the rotary switch 16 is manually rotated until it is aligned with the throw position marked with the indicia 450 CCA as shown in FIG. 1. Next, one of the test mode switches 24 or 26 is depressed or actuated manually by the user. Conventionally, if the temperature is above 32° F., the normal test mode switch 24 is actuated; otherwise, the cold test mode switch 26 is actuated. In either case, the AC load circuit 40 is enabled upon actuation of one of the switches 24 or 26 and an AC signal is induced across the terminals of the battery under test.

The electronic tester unit measures and filters the AC signal by the circuits 44 and 50 to render a substantially DC voltage potential signal, representative of the internal resistance of the battery, over line 52 which is adjusted in value by the voltage divider network 54 in accordance with the battery rating setting of the rotary switch 16. For this example, the rotary switch 16 was set to 450 CCA causing the pole position to be connected to the tap T21. Accordingly, the voltage at the tap T21 will be compared with the threshold voltage over line 60 in comparator circuit 56. Note that the value of the threshold voltage potential is dependent on which switch 24 or 26 (i.e. normal or cold test mode) is actuated. If the measured voltage potential over line 58 is greater than the threshold voltage potential which is an indication of an internal resistance of a battery that needs replaced. In this state, the, comparator circuit 56 drives the indicator 22 "on" which may be visually observed by the user. On the other hand, if the measured voltage potential is less than the threshold voltage potential which is an indication that the internal resistance of the battery is still in a good operating range, the comparator circuit 56 drives the indicator 20 "on".

A user may also operate the battery tester 10 to determine a measure of the battery's condition or the amount of power the battery under test is capable of delivering, i.e. the current CCA rating of the battery. By visually observing the indicators 20 and 22, the user may rotate manually the rotary switch 16 sequentially through its throw positions which operation sequentially selects the voltage potential signals along the taps of the voltage divider network 16 for comparison with the threshold voltage potential in the comparator circuit 56. With each new position of the rotary switch 16, the comparator circuit 56 compares a newly selected voltage potential from a correspondingly connected tap along the voltage divider network 54. As the rotary switch is rotated sequentially through increasing CCA increments, the voltage potential selected by the switch from the voltage divider network will increase incrementally and commensurately therewith and vice versa. When the indicators 20 and 22 change state as visually observed by the user, the indicia of the current throw position of the switch 16 is used to determine the condition of the battery. In this manner, the condition of the battery may be determined based on the observations of the change in state of the indicators 20 and 22 and the indicia of the throw position of the rotary switch rendering such change in indicator state. For example, when the indicator 20 goes "off" and indicator 22 goes "on" as a result of the switch being rotated to a new throw position, it is an indication that the measured internal resistance of the battery based on the indicia rating of the current throw position exceeds its threshold voltage potential setting. Accordingly, the indicia rating of the current throw position of the rotary switch 16 may be considered as exceeding the power the battery is capable of delivering.

While the present invention has been described herein above in connection with a specific embodiment, it is understood that the embodiment is being provided simply by way of example and not intended to limit the invention in any way, shape or form. Accordingly, the present invention should not be limited to any single embodiment, but rather construed in breadth and broad scope in accordance with the recitation of the appended claims.

What is claimed is:

1. Method of measuring a condition of a battery using a measure of the internal resistance thereof comprising the steps of:

inducing an AC signal across the terminals of the battery by applying an AC current load thereto;

measuring the induced AC signal and converting it to a first voltage potential signal which is a measure of the battery's internal resistance;

applying the first voltage potential signal across a voltage divider network calibrated in accordance with a predetermined battery rating scale to render a multiplicity of second voltage potential signals at a corresponding multiplicity of taps along the voltage divider network, values of said second voltage potential signals being representative of the calibrated battery rating scale; and sequentially selecting the second voltage potential signals along the taps for comparison with a threshold voltage potential signal to determine a measure of the condition of the battery.

2. The method of claim 1 wherein the voltage divider network is calibrated in accordance with the battery manufacture's "cold cranking amperes" (CCAs) rating which corresponds with an original internal resistance of the battery; and wherein the selected second voltage potential signals are compared with a threshold voltage potential signal representative of an internal resistance measurement corresponding to a battery of a predetermined CCA rating.

3. The method of claim 2 wherein the threshold voltage potential signal used for comparison is representative of an internal resistance measurement corresponding to a battery of the highest CCA rating of the scale of CCA ratings.

4. The method of claim 1 wherein the step of sequentially selecting includes the steps of:

connecting the multiplicity of taps of the voltage divider network to corresponding throw positions of a single pole multiple throw rotary switch;

rotating the switch sequentially through its throw positions to render the second voltage potential signals at the pole position;

comparing the second voltage potential signal at the pole position of the rotary switch with the threshold voltage potential signal in a comparator circuit; and driving an indicator by the comparator circuit based on the result of said comparison.

5. The method of claim 4 including the steps of:

marking the throw positions of the rotary switch with indicia of battery ratings corresponding to the battery rating scale of the calibration;

driving said indicator in first and second states based on the comparison results of the selected second voltage potential signal and the threshold voltage potential signal; and determining the measure of the battery condition based on the observation of the state of the indicator and the indicia of the throw position of the rotary switch.

6. The method of claim 5 including the steps of:

driving said indicator from the first state to the second state when the switch is rotated to a throw position in which the corresponding second voltage potential signal exceeds the threshold voltage potential signal; and determining the measure of the battery condition based on the observation of the indicator being switched to the second state and the indicia of the throw position of the rotary switch rendering said change in indicator state.

7. The method of claim 5 wherein the rotary switch is manually rotated sequentially through its throw positions.

8. The method of claim 5 wherein the state of the indicator is visually observed.

9. The method of claim 5 wherein the indicia of the throw position rendering the change in indicator state is visually observed.

10. The method of claim 1 wherein the measure of the condition of the battery is representative of the amount of power the battery is capable of delivering.

11. An electronic battery tester comprising:

a first circuit for applying an AC current load to the battery under test to induce an AC signal across the terminals of the battery;

a second circuit for measuring the induced AC signal and converting it to a first voltage potential signal which is a measure of the battery's internal resistance;

a voltage divider network coupled across the first voltage potential signal, said voltage divider network calibrated in accordance with a predetermined battery rating scale to create from the first voltage potential signal a multiplicity of second voltage potential signals at a corresponding multiplicity of taps along the voltage divider network, values of said second voltage potential signals being representative of the calibrated battery rating scale; and means for selecting the second voltage potential signal of the multiplicity of second voltage potential signals along the taps based on a predetermined battery rating of the battery under test for comparison with a threshold voltage potential signal to determine a condition of the battery.

12. The batter tester of claim 11 wherein the voltage divider network is calibrated in accordance with the battery manufacture's "cold cranking amperes" (CCAs) rating which corresponds with an original internal resistance of the battery; and including a third circuit for generating the threshold voltage potential signal representative of an internal resistance measurement corresponding to a battery of a predetermined CCA rating.

13. The battery tester of claim 12 wherein the threshold voltage potential signal is generated as being representative of an internal resistance measurement corresponding to a battery of the highest CCA rating of the scale of CCA ratings.

14. The battery tester of claim 11 wherein the selecting means includes:

a single pole multiple throw rotary switch wherein the multiplicity of taps of the voltage divider network are connected to corresponding throw positions of the single pole multiple throw rotary switch;

a comparator circuit wherein the pole position of the rotary switch is connected to one input thereof and the threshold voltage potential signal is connected to another input thereof, the second voltage potential signal at the pole position of the rotary switch and the threshold voltage potential signal being compared in the comparator circuit; and an indicator driven by the comparator circuit based on the result of said comparison to indicate the condition of the battery.

15. The battery tester of claim 14 wherein the throw positions of the rotary switch are marked with indicia of battery ratings corresponding to the battery rating scale of the calibration.

16. The battery tester of claim 14 wherein the indicator is driven by the comparator circuit into pass and replace states based on the comparison results of the second voltage potential signal selected by the rotary switch and the threshold voltage potential signal to indicate the condition of the battery.

17. The battery tester of claim 11 wherein the voltage divider network is calibrated in equal increments of the industry standard battery rating scale.

18. The batter tester of claim 11 wherein the voltage divider network is calibrated in accordance with the battery manufacture's "cold cranking amperes" (CCAs) rating which corresponds with an original internal resistance of the battery and divided into equal increments representative of CCA increments.

19. The battery tester of claim 18 wherein the voltage divider network is calibrated over a range of hundreds of CCAs.

20. The battery tester of claim 11 wherein the voltage divider network comprises a resistance divider network.

* * * * *